(12) United States Patent
Li et al.

(10) Patent No.: US 9,897,236 B2
(45) Date of Patent: Feb. 20, 2018

(54) PIPE HOLDING CONNECTION STRUCTURE AND HIGH FREQUENCY ANTENNA DEVICE INCLUDING THE SAME

(71) Applicant: NISSIN ELECTRIC CO., LTD., Kyoto (JP)

(72) Inventors: Dongwei Li, Kyoto (JP); Yasunori Ando, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 0 days.

(21) Appl. No.: 15/546,664

(22) PCT Filed: Jan. 22, 2016

(86) PCT No.: PCT/JP2016/051762
§ 371 (c)(1),
(2) Date: Jul. 27, 2017

(87) PCT Pub. No.: WO2016/121626
PCT Pub. Date: Aug. 4, 2016

(65) Prior Publication Data
US 2017/0370504 A1    Dec. 28, 2017

(30) Foreign Application Priority Data

Jan. 28, 2015   (JP) ................ 2015-013920

(51) Int. Cl.
| | | |
|---|---|---|
| *F16L 15/04* | (2006.01) | |
| *F16L 5/08* | (2006.01) | |
| *H01J 37/32* | (2006.01) | |

(52) U.S. Cl.
CPC ............. *F16L 15/04* (2013.01); *F16L 5/08* (2013.01); *H01J 37/3211* (2013.01); *H01J 37/3244* (2013.01); *H01J 2237/002* (2013.01)

(58) Field of Classification Search
CPC ...... F16L 5/02; F16L 5/12; F16L 15/04; F16L 41/04; F16L 41/082; F16L 25/021;
(Continued)

(56) References Cited

U.S. PATENT DOCUMENTS 4,542,846 A * 9/1985 Matsui ................. B23K 20/129
228/114.5
7,784,835 B1 * 8/2010 Keays ..................... F16L 27/04
285/145.3
(Continued)

FOREIGN PATENT DOCUMENTS

JP    H01-031831    9/1989
JP    H01-040225    12/1989
(Continued)

OTHER PUBLICATIONS

"International Search Report (Form PCT/ISA/210)", dated Apr. 12, 2016, with English translation thereof, pp. 1-4.

*Primary Examiner* — Haissa Philogene
(74) *Attorney, Agent, or Firm* — JCIPRNET

(57) ABSTRACT

Provided is a pipe holding connection structure configured so that the width of the entire structure is reduced and so that the number of parts and the number of assembly work processes are reduced. This pipe holding connection structure is provided with: a housing affixed so as to air-tightly close the opening of a vacuum container; a first pipe having a portion near an end portion thereof extending through both the opening and the housing; and a second pipe having a female thread part engaging with a male thread part located at the end portion. The pipe has a locking part. Fluid is caused to flow through both the pipes. Pieces of packing are provided between the pipe and the housing and between the pipe and an end portion of the pipe, respectively. This pipe holding connection structure can be used for a high-frequency antenna device.

6 Claims, 9 Drawing Sheets

(58) Field of Classification Search
CPC ..... F16L 25/023; F16L 25/028; F16L 25/065;
F16L 25/08; F16L 58/182; F16L 58/184;
H01J 37/16; H01J 37/18
See application file for complete search history.

(56) References Cited

U.S. PATENT DOCUMENTS

| 8,528,186 | B2* | 9/2013 | Crawford | ................ | B63C 7/006 |
| | | | | | 114/221 A |
| 9,508,526 | B2* | 11/2016 | Miyamoto | .............. | H01J 37/20 |
| 2006/0099843 | A1 | 5/2006 | Fullner et al. | | |

FOREIGN PATENT DOCUMENTS

| JP | H07-208656 | 8/1995 |
| JP | H08-165572 | 6/1996 |
| JP | 2011-241917 | 12/2011 |

\* cited by examiner

PIPE HOLDING CONNECTION STRUCTURE AND HIGH FREQUENCY ANTENNA DEVICE INCLUDING THE SAME

CROSS-REFERENCE TO RELATED APPLICATION

This application is a 371 application of the international PCT application serial no. PCT/JP2016/051762, filed on Jan. 22, 2016, which claims the priority benefit of Japan application no. 2015-013920, filed on Jan. 28, 2015. The entirety of each of the above-mentioned patent applications is hereby incorporated by reference herein and made a part of this specification.

TECHNICAL FIELD

The present invention relates to a pipe-holding connection structure and a high frequency antenna device including the same. The pipe-holding connection structure is used for a vacuum device including, for example, a vacuum container such as a plasma processing device and an ion source. A first pipe is held and the first pipe and a second pipe are connected to each other in a portion in which a pipe passes through an opening in a vacuum container, wherein through the pipe a fluid flows.

BACKGROUND ART

Patent Literature 1 discloses an example of a pipe holding connection structure. In the pipe holding connection structure, a first pipe is held and the first pipe and a second pipe are connected to each other in a portion in which a pipe passes through an opening in a vacuum container, wherein through the pipe a fluid flows. This will be described with reference to FIG. 1.

A housing 8 is fixed to an outer wall in a vacuum container 4 with an opening 6 using bolts 10 to air-tightly close the opening 6. An O ring 12 configured to vacuum-seal between the housing 8 and the vacuum container 4 is provided between the housing 8 and the vacuum container 4.

A portion near an end portion of a first pipe 16 passes through the opening 6 in the vacuum container 4 and the housing 8, wherein the first pipe 16 is provided inside the vacuum container 4 and through the first pipe 16 a fluid 2 flows. O rings 14 configured to vacuum-seal between the housing 8 and the first pipe 16 are provided between the housing 8 and the first pipe 16. The fluid 2 may be, for example, a cooling medium such as cooling water or various gases used to cool the first pipe 16.

An end portion of the first pipe 16 is inserted into an end portion of a second pipe 18, wherein the second pipe 18 is provided outside the vacuum container 4 and through the second pipe 18 the fluid 2 flows. The two pipes 16 and 18 are connected to each other, and the connection thereof is sealed by an O ring 28. Outward movement of the first pipe 16 from the vacuum container 4 is stopped by a locking part 20.

A flange 22 is provided on an end portion of the second pipe 18, at least two stud bolts 24 are provided between the flange 22 and screw holes 9 in the housing 8, and the pipe 18 is fixed to the housing 8 by the stud bolts 24. Reference numeral 26 is a nut.

The first pipe 16 is held with respect to the vacuum container 4 using the above-described structure and thus the pipe 16 and the pipe 18 can be connected. Therefore, the fluid 2 can be supplied from the pipe 18 to the pipe 16 or from the pipe 16 to the pipe 18.

CITATION LIST

Patent Literature

[Patent Literature 1]
Japanese Unexamined Patent Application Publication No. 2011-241917 (paragraphs 0019 to 0028 and FIG. 2)

SUMMARY OF INVENTION

Technical Problem

In the above-described conventional pipe holding connection structure, in order to secure sealing performance or the like between the first pipe 16 and the second pipe 18 using the O ring 28, the second pipe 18 needs to be firmly fixed without being tilted with respect to the housing 8. For this reason, at least two stud bolts 24 are required. Moreover, since the screw holes 9 into which the stud bolts 24 are screwed need to be provided in the housing 8 and thus spaces are required in amounts corresponding to these, a width of the entire structure is greater.

Also, since at least two stud bolts 24 and at least two nuts 26 are required for one first pipe 16, the number of parts is greater and there are more assembly work processes when coupling and assembling them.

Therefore, one objective of the present invention is to provide a pipe holding connection structure in which the above-described problems are resolved, wherein a width of the entire structure can be decreased and the number of parts and assembly work processes can be reduced.

Another objective thereof is to provide a high frequency antenna device which includes such a pipe holding connection structure.

Solution to Problem

A first pipe holding connection structure according to the present invention is a portion of a pipe passing through an opening in a vacuum container, through the pipe a fluid flows, and the pipe holding connection structure includes: a housing fixed to an outer wall of the vacuum container to air-tightly close the opening; a first pipe provided inside the vacuum container, wherein through the first pipe the fluid flows, a portion near an end portion of the first pipe passes through the opening in the vacuum container and the housing, the first pipe has a locking part near the end portion, the locking part is engaged with an end portion of the housing on the vacuum container side so as to stop outward movement of the first pipe from the vacuum container, and the first pipe has a male thread part on the end portion thereof; a packing configured to vacuum-seal between the housing and the first pipe; a second pipe provided outside the vacuum container, wherein through the second pipe the fluid flows, the second pipe has a female thread part on the end portion thereof, and the female thread part is screwed to the male thread part of the first pipe to connect two pipes; and a packing configured to seal between the end portion of the first pipe and the end portion of the second pipe.

In the first pipe holding connection structure, outward movement of the first pipe from the vacuum container can be stopped by the locking part. Furthermore, since a structure in which a male thread part in the end portion of the first pipe is screwed to a female thread part in the end portion of the second pipe and thus these pipes are connected is provided, the first pipe and the second pipe can be connected to each other while sealing performance using a packing is secured between these pipes without using stud bolts, nuts, and the like as in the related art.

A second pipe holding connection structure according to the present invention is a portion of a pipe passing through an opening in a vacuum container, through the pipe a fluid flows, and the pipe holding connection structure includes: a housing fixed to an outer wall of the vacuum container to air-tightly close the opening and having a through hole and a first female thread part and a second female thread part joined to the through hole therein; a first pipe provided inside the vacuum container, wherein through the first pipe the fluid flows, a portion near an end portion of the first pipe passes through the opening in the vacuum container, the first pipe has a locking part near the end portion, the locking part is engaged with an end portion of the housing on the vacuum container side so as to stop outward movement of the first pipe from the vacuum container, the first pipe has a male thread part on the end portion thereof, and the male thread part is screwed to the first female thread part of the housing to connect the first pipe and the housing; a packing configured to vacuum-seal between the housing and the first pipe; a second pipe provided outside the vacuum container, wherein through the second pipe the fluid flows; and a joint which has a portion connected to an end portion of the second pipe and a male thread part screwed to the second female thread part in the housing and connects the second pipe to the housing when the fluid has been sealed.

In the second pipe holding connection structure, outward movement of the first pipe from the vacuum container can be stopped by the locking part. In addition, since a structure in which the male thread part in the end portion of the first pipe is screwed to the first female thread part in the housing is provided, axial movement of the first pipe can be reliably stopped in cooperation with the locking part.

Also, since a structure in which the male thread part in the end portion of the first pipe is screwed to the first female thread part in the housing and the second pipe is connected to the housing using the joint screwed to a second female thread part in the housing is provided, the first pipe and the second pipe can be connected to each other while sealing performance of connections is secured without using stud bolts, nuts, and the like as in the related art.

In the high frequency antenna device according to the present invention, the first pipe is made of a conductor, portions near both end portions thereof pass through two openings provided in a wall surface in the vacuum container, and the first pipe holding connection structure or the second pipe holding connection structure is provided in a portion in which a portion near each of the end portions of the first pipe passes through the opening. The first pipe holding connection structure may be provided in a portion near one of the end portions of the first pipe, and the second pipe holding connection structure may be provided in a portion near the other one of the end portions.

Advantageous Effects of Invention

According to the invention disclosed in claim 1, since a structure in which a male thread part in an end portion of a first pipe is screwed to a female thread part in an end portion of a second pipe and thus these pipes are connected to each other is provided, the first pipe can be connected to the second pipe while sealing performance using a packing can be secured between these pipes without using stud bolts, nuts, and the like as in the related art. As a result, a width of the entire structure can be decreased and the number of parts and assembly work processes can be decreased compared with a case in which stud bolts, nuts, and the like are used.

According to the invention disclosed in claim 2, since a structure in which a male thread part in an end portion of a first pipe is screwed to a first female thread part in a housing and a second pipe is connected to the housing using a joint screwed to a second female thread part in the housing is provided, the first pipe can be connected to the second pipe while sealing performance of connections is secured without using stud bolts, nuts, and the like as in the related art. As a result, a width of the entire structure can be decreased and the number of parts and assembly work processes can be decreased compared with a case in which stud bolts, nuts, and the like are used.

Also, since a structure in which a second pipe is connected to a housing with a joint is provided, a degree of freedom of selection of a shape, a material, and the like of the second pipe is increased.

According to the invention disclosed in claim 3, a high frequency antenna device in which the same effects as the effects of the invention disclosed in claim 1 are accomplished can be realized.

According to the invention disclosed in claim 4, a high frequency antenna device in which the same effects as the effects of the invention disclosed in claim 2 are accomplished can be realized.

According to the invention disclosed in claim 5, a high frequency antenna device in which a portion including the pipe holding connection structure disclosed in claim 1 accomplishes the same effects as the effects disclosed in claim 1, and a portion including the pipe holding connection structure disclosed in claim 2 accomplishes the same effects as the effects disclosed in claim 2 can be realized.

According to the invention disclosed in claim 6, the following further effects are accomplished. That is, a structure in which a first pipe functioning as a high frequency antenna is divided into a plurality of compartments using hollow insulators and the plurality of compartments are electrically connected to each other in series using capacitors provided on outer circumferential portions of the hollow insulators is provided, so that a combined reactance of the first pipe is obtained simply by subtracting a capacitive reactance from an inductive reactance, and an impedance of the first pipe can be reduced. As a result, even when the first pipe is long, an increase in impedance thereof can be minimized. Therefore, generation of a significant potential difference between both end portions of the first pipe can be prevented. Furthermore, since an increase in impedance thereof can be minimized even when the first pipe is long, a high frequency current easily flows through the first pipe.

According to the invention disclosed in claim 7, the following further effects are accomplished. That is, if a portion of a first pipe located inside a vacuum container is disposed inside an insulating pipe, the first pipe can be protected using the insulating pipe. For example, even when a high frequency antenna device is used for plasma generation, incidence of charged particles in plasma on the first pipe can be prevented. As a result, an increase in plasma potential due to incidence of plasma on the first pipe can be minimized and sputtering of the first pipe due to charged particles in plasma can be prevented.

DESCRIPTION OF EMBODIMENTS (1) Pipe Holding Connection Structure

Figure 1:
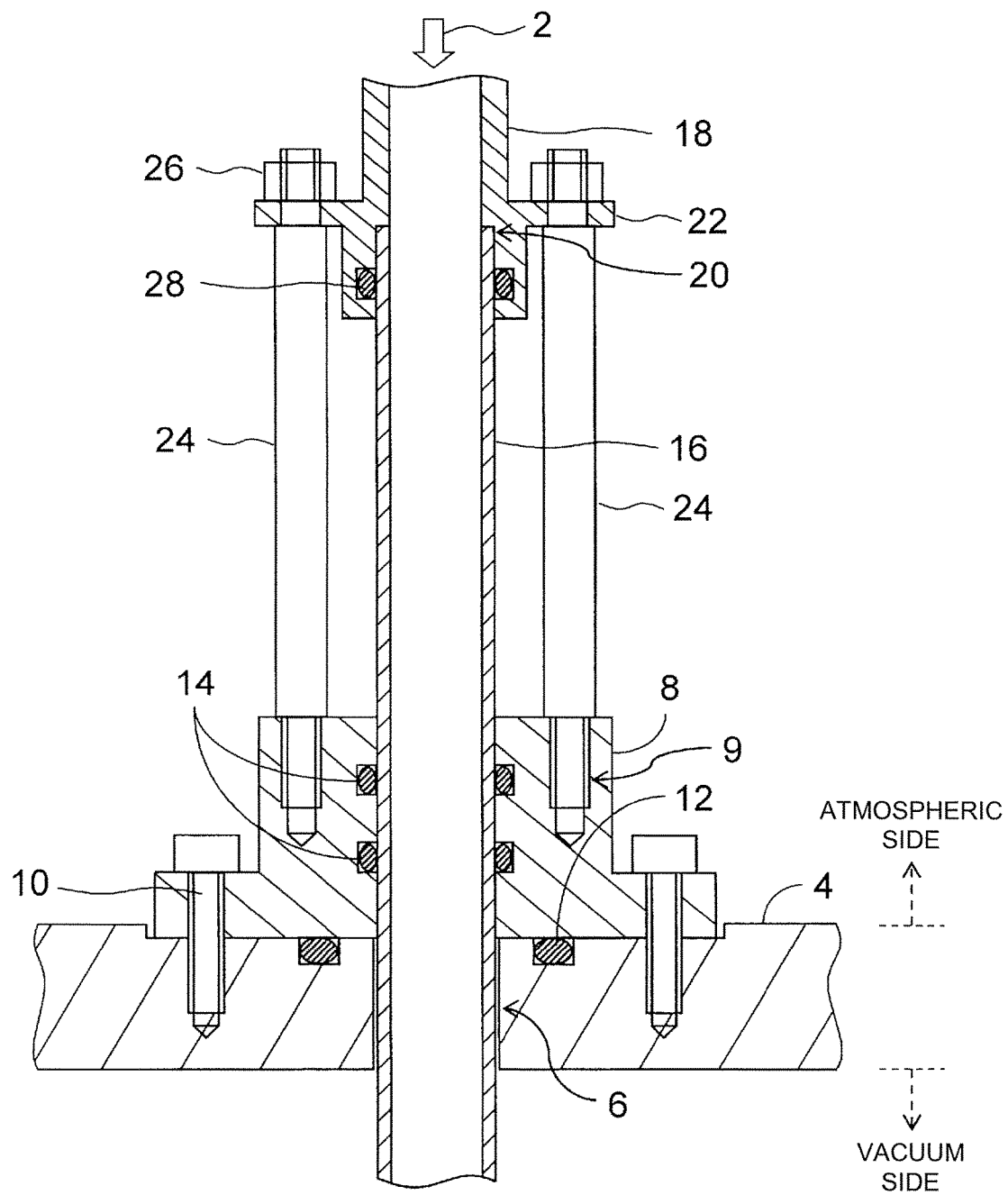
FIG. 1 is a cross-sectional view illustrating an example of a conventional pipe holding connection structure.
Figure 2:
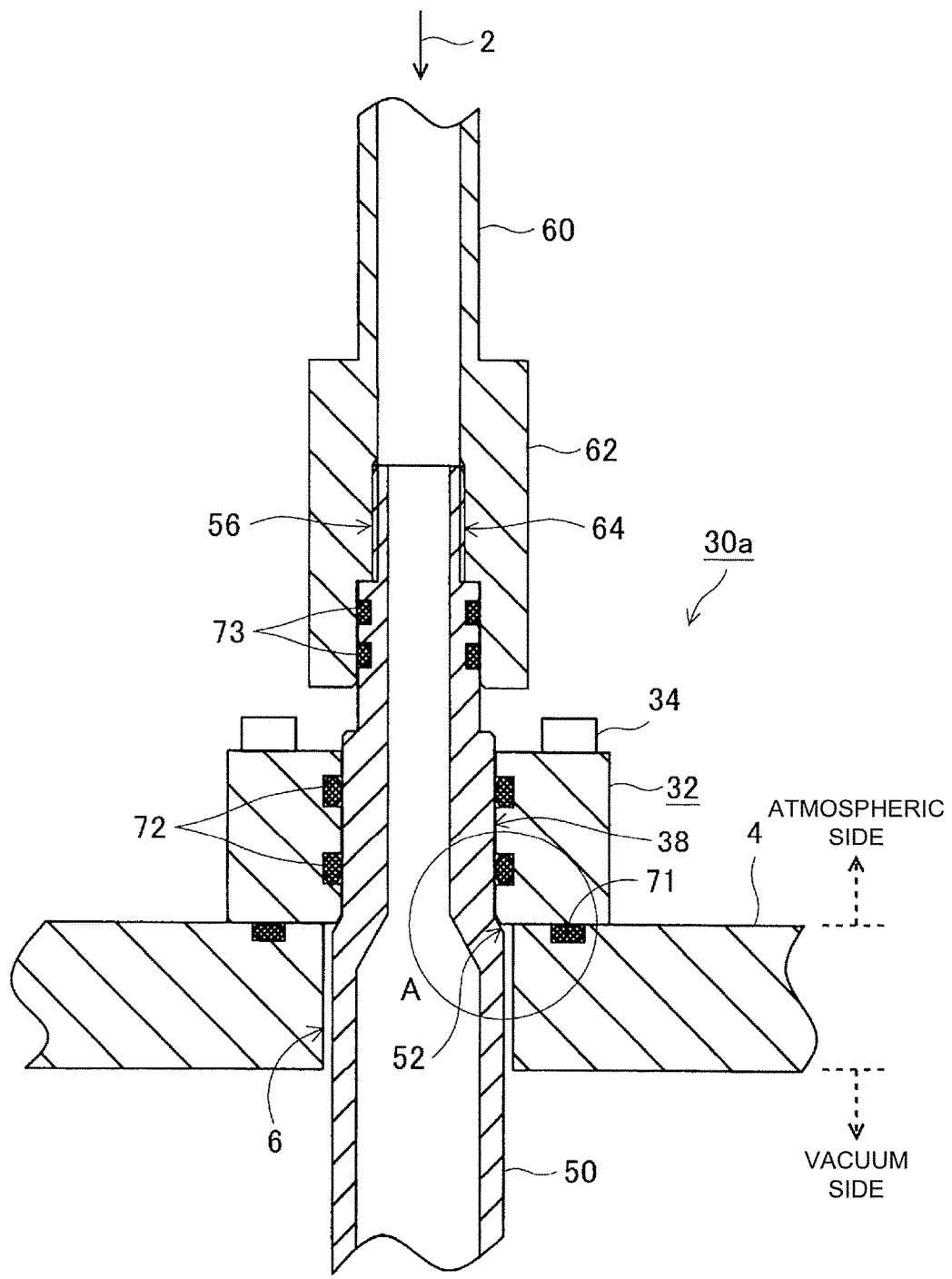
FIG. 2 is a cross-sectional view showing an embodiment of a pipe holding connection structure according to the present invention viewed in a direction of line D-D.

FIG. 2 shows an embodiment of a pipe holding connection structure according to the present invention.

A pipe holding connection structure 30a is a portion of a pipe (a first pipe 50 in this embodiment) passes through an opening 6 in a vacuum container 4, wherein through the pipe a fluid 2 flows. The vacuum container 4 is made of, for example, a metal. The opening 6 may be directly formed in the vacuum container 4 and may be formed in a flange attached to the vacuum container 4. Since the flange can be regarded as a part of the vacuum container 4 in the latter case, these are collectively referred to as an opening 6 in the vacuum container 4 in both cases in the present invention.

Figure 7:
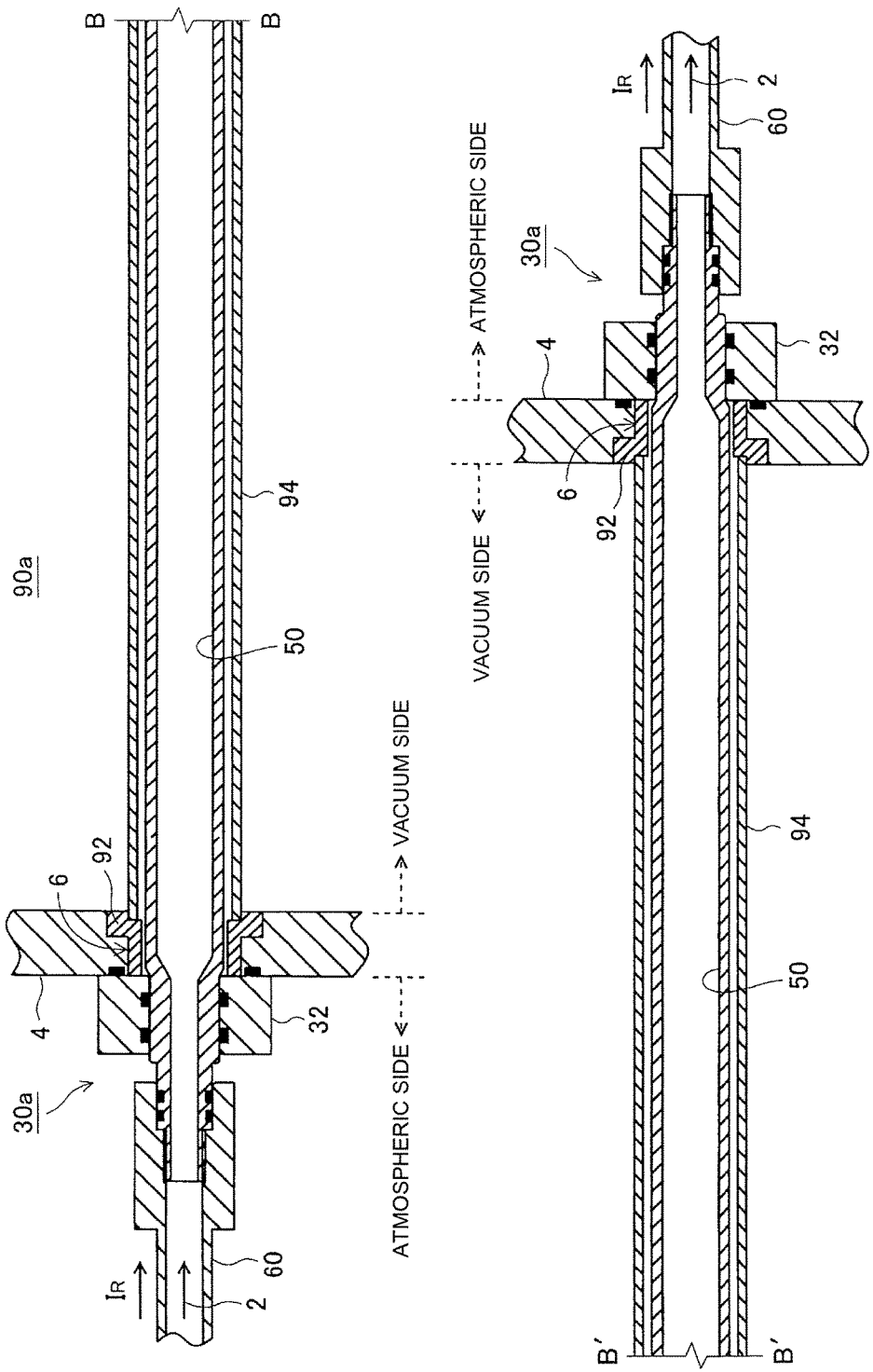
FIG. 7 is a cross-sectional view showing an embodiment of a high frequency antenna device according to the present invention in which line B'-B' continues from line B-B in the drawing.
Figure 8:
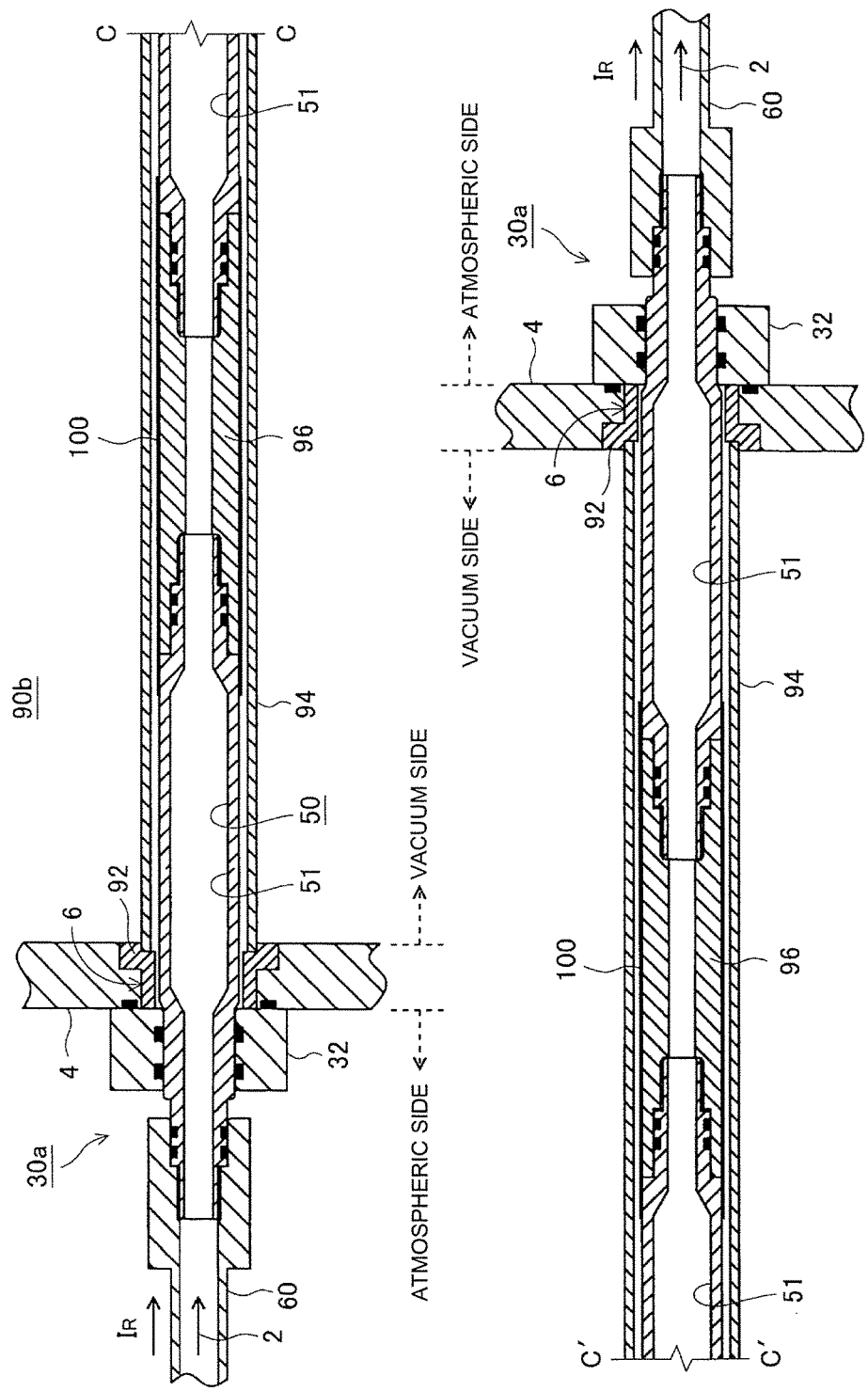
FIG. 8 is a cross-sectional view showing another embodiment of the high frequency antenna device according to the present invention in which line C'-C' continues from line C-C in the drawing.

The fluid 2 is a liquid or a gas. For example, when the pipe 50 is cooled as a countermeasure against heat generated by the first pipe 50 or heat transferred from another portion to the first pipe 50, a cooling medium such as cooling water may be adopted as the fluid 2. High frequency antenna devices 90a and 90b shown in FIGS. 7 and 8 are examples in this case. Furthermore, when various gases are introduced into the vacuum container 4 via the first pipe 50, various gases may be adopted as the fluid 2.

Figure 3:
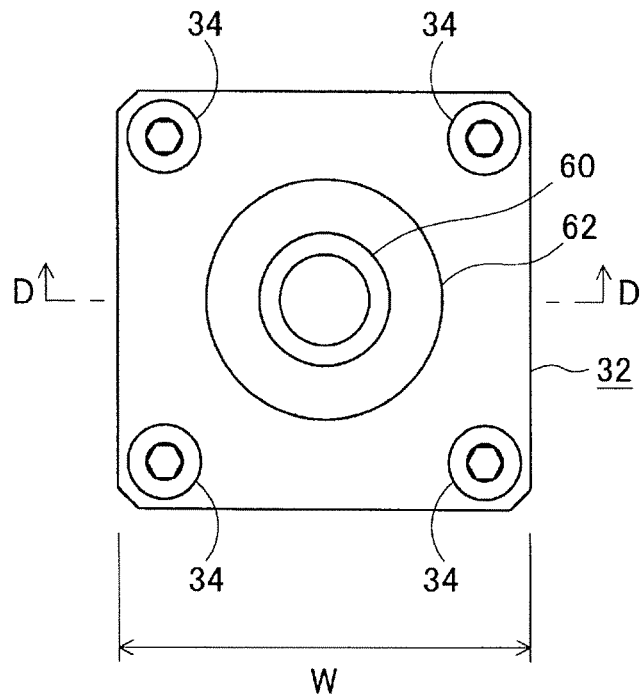
FIG. 3 is a plan view showing the vicinity of a flange in FIG. 2.

A housing 32 is fixed to an outer wall of the vacuum container 4 using four bolts 34 so that the opening 6 is air-tightly closed in this embodiment. FIG. 3 illustrates an example in which the bolts 34 are arranged in a planar manner. When the bolts 34 are arranged at the four corners of the housing 32 like in this example, a width W of the housing 32 can be further decreased. A packing 71 configured to vacuum-seal between the housing 32 and the vacuum container 4 is provided between the housing 32 and the vacuum container 4. The housing 32 is made of, for example, a metal and is made of an insulating material in some cases (which will be described below).

The packing 71 is, for example, an O ring but may be other packings. The same applies to other packings 72 to 77 which will be described below.

A portion near an end portion of the first pipe 50 passes through the opening 6 in the vacuum container 4 and the housing 32, wherein the first pipe 50 is provided inside the vacuum container 4 and through the first pipe 50 the fluid 2 flows. A male thread part 56 is provided in the end portion of the pipe 50.

Figure 4:
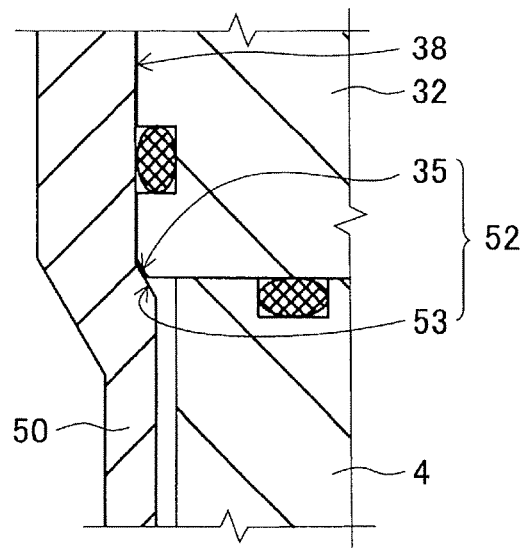
FIG. 4 is an enlarged diagram of a portion A in FIG. 2.

The first pipe 50 further includes, near the end portion thereof, locking parts 52 configured to be engaged with an end portion of the housing 32 on the vacuum container 4 side and to stop outward movement of the pipe 50 from the vacuum container 4. FIG. 4 is an enlarged diagram of an example of the locking parts 52. The housing 32 includes a circular-cone-shaped part 35 near an end portion of a through hole 38 on a vacuum container 4 side, an outer circumferential portion of the pipe 50 has a circular-cone-shaped part 53 which has a shape corresponding to the circular-cone-shaped part 35, and the circular-cone-shaped part 53 is engaged with the circular-cone-shaped part 35 to stop the outward movement of the pipe 50 from the vacuum container 4. The locking parts 52 are constituted using such circular-cone-shaped parts 35 and 53 so that a central axis of the pipe 50 is easily aligned with a central axis of the housing 32 (specifically, the through hole 38). Here, the locking parts 52 may include flat parts 36 and 54 like in an example illustrated in FIG. 5.

Outward movement from the vacuum container 4 in axial movement of the first pipe 50 can be stopped by the locking parts 52. In the case of movement of the pipe 50 in a direction opposite to the above-described direction, for example, movement due to thermal expansion or the like can be allowed.

The packing 72 configured to vacuum-seal between the housing 32 and the first pipe 50 is provided between the housing 32 and the first pipe 50.

The pipe holding connection structure 30a further includes a second pipe 60 which is provided outside the vacuum container 4 and through which the fluid 2 flows. An end portion of the pipe 60 has a female thread part 64 which is screwed to the male thread part 56 of the first pipe 50 and configured to connect both of the pipes 50 and 60. In this example, the female thread part 64 is formed inside a female connector 62 provided in the end portion of the pipe 60.

The packing 73 configured to seal between the end portion of the first pipe 50 and the end portion of the second pipe 60 is provided between the end portion of the first pipe 50 and the end portion of the second pipe 60.

Materials of the first pipe 50 and the second pipe 60 may be, for example, a metal such as copper, aluminum, an alloy thereof, and stainless steel, but the present invention is not limited thereto. The same applies to another embodiment which will be described below. A material of the housing 32 in a case in which it is made of a metal is also the same as above.

The pipe holding connection structure 30a can hold the first pipe 50 with respect to the vacuum container 4 using the above-described structure and connect the first pipe 50 to the second pipe 60. Therefore, the fluid 2 can be supplied from the pipe 60 to the pipe 50 or from the pipe 50 to the pipe 60.

Since the pipe holding connection structure 30a has a structure in which the male thread part 56 in the end portion of the first pipe 50 is screwed to the female thread part 64 in the end portion of the second pipe 60 to connect both of the pipes 50 and 60, the first pipe 50 and the second pipe 60 can be connected while sealing performance using the packing 73 is secured between both of the pipes 50 and 60 without using stud bolts, nuts, and the like as in the related art. As a result, the width W (refer to FIG. 3) of the entire structure 30a can be decreased and the numbers of parts and assembly work processes can be decreased compared with a case in which stud bolts, nuts, and the like are used.

Figure 5:
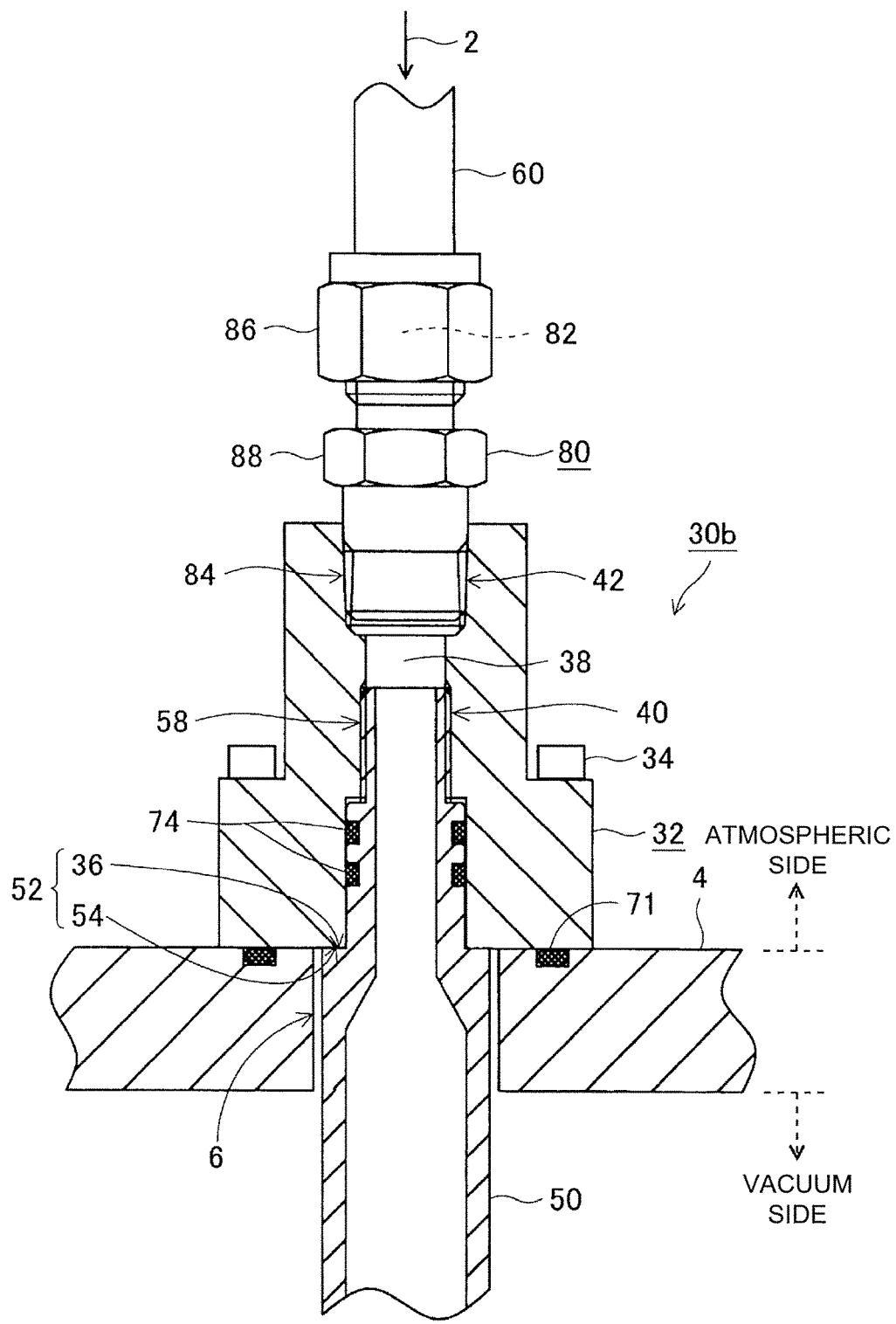
FIG. 5 is a cross-sectional view showing another embodiment of the pipe holding connection structure according to the present invention.

Next, FIG. 5 illustrates another embodiment of the pipe holding connection structure. Parts which are the same as or equivalent to those of the pipe holding connection structure 30a are denoted with the same reference numerals and differences therebetween will be mainly described in the following description.

A through hole 38 and a first female thread part 40 and a second female thread part 42 joined to the through hole 38 are provided inside the housing 32 constituting the pipe holding connection structure 30b shown in FIG. 5. A structure in which the housing 32 is fixed to an outer wall of the vacuum container 4 such that the opening 6 is air-tightly closed is the same as the case of the above-described pipe holding connection structure 30a.

The portion near the end portion of the first pipe 50 provided inside the vacuum container 4 passes through the opening 6 in the vacuum container 4. The end portion of the pipe 50 has a male thread part 58 which is screwed to the first female thread part 40 in the housing 32 to connect the pipe 50 to the housing 32.

The portion near the end portion of first pipe 50 further has the locking parts 52 which are engaged with the end portion of the housing 32 on the vacuum container 41 side and are configured to stop outward movement of the pipe 50 from the vacuum container 4. To be specific, the housing 32 has the flat part 36 near an end portion of the through hole 38 on the vacuum container 4 side, and the outer circumferential portion of the pipe 50 has the flat part 54 which is engaged with the flat part 36 and is configured to stop the outward movement of the pipe 50 from the vacuum container 4. The locking parts 52 are constituted using the above-described flat parts 36 and 54 so that the outward movement of the pipe 50 from the vacuum container 4 can be more reliably stopped at a fixed position. Here, the locking parts 52 may have the circular-cone-shaped parts 35 and 53 as in an example illustrated in FIGS. 2 and 4.

The outward movement from the vacuum container 4 in the axial movement of the first pipe 50 can be stopped by the locking parts 52. In addition, since a structure in which the male thread part 58 in the end portion of the first pipe 50 is screwed to the first female thread part 40 in the housing 32 is provided, the axial movement of the first pipe 50 can be more reliably stopped in cooperation with the locking parts 52. The central axis of the pipe 50 can be reliably aligned with the central axis of the housing 32.

The packing 74 configured to vacuum-seal between the housing 32 and the first pipe 50 is provided between the housing 32 and the first pipe 50.

The pipe holding connection structure 30b includes the second pipe 60 which is provided outside the vacuum container 4 and through which the fluid 2 flows.

The pipe holding connection structure 30b further includes a joint 80 configured to connect the second pipe 60 to the housing 32 in a state in which the fluid 2 is sealed. The joint 80 has a pipe through hole 82 which is a portion used to connect the end portion of the pipe 60 to a male thread part 84 which is screwed to the second female thread part 42 in the housing 32.

The joint 80 is, for example, a well-known ferrule joint and includes a ferrule (a tightening ring) therein. In addition, a nut 86 is tightened by inserting the end portion of the second pipe 60 into the pipe through hole 82 so that the pipe 60 and the joint 80 can be coupled. In this state, a nut part 88 is rotated so that the joint 80 can be coupled to the housing 32 or the coupling can be released. Here, the joint 80 is not limited to a ferrule joint.

Note that examples of a ferrule joint are described in much patent literature. For example, an example of a ferrule joint is described in Japanese Unexamined Patent Application Publication No. 2006-207795.

The second female thread part 42 in the housing 32 and the male thread part 84 in the joint 80 may be normal parallel threads and tapered threads. When they are set as tapered threads, sealing performance can be further improved.

The pipe holding connection structure 30b can hold the first pipe 50 with respect to the vacuum container 4 using the above-described structure and connect the first pipe 50 to the second pipe 60. Therefore, the fluid 2 can be supplied from the pipe 60 to the pipe 50 or from the pipe 50 to the pipe 60.

Since the pipe holding connection structure 30b has a structure in which the male thread part 58 in the end portion of the first pipe 50 is screwed to the first female thread part 40 in the housing 32 and thus the second pipe 60 is connected to the housing 32 using the joint 80 screwed to the second female thread part 42 in the housing 32, the first pipe 50 and the second pipe 60 can be connected to each other while sealing performance of connections is secured without using stud bolts, nuts, and the like as in the related art. As a result, the width W (refer to FIG. 3) of the entire structure 30b can be decreased and the numbers of parts and assembly work processes can be decreased compared with a case in which stud bolts, nuts, and the like are used.

In addition, since the second pipe 60 has a structure in which it is connected to the housing 32 with the joint 80, a degree of freedom of selection of a shape, a material, and the like of the second pipe 60 is increased. For example, since the pipe 60 can be connected to the housing 32 while being bent using a flexible tube or the like as the second pipe 60, the pipe 60 is easily arranged even in a confined place.

The pipe holding connection structures 30a and 30b can be used for, for example, a high frequency antenna device constituting a plasma processing device or the like. This will be described in detail below. In addition, they can also be used for an ion source or the like. For example, a feedthrough (a current introduction terminal) configured to supply a cooling medium and power can be used for electrodes or filaments provided inside a vacuum container constituting an ion source. In this case, the first pipe 50 is directly or indirectly connected to the electrodes or the filaments.

(2) High Frequency Antenna Device

Next, an embodiment of a high frequency antenna device including the pipe holding connection structures 30a and 30b will be described. Parts which are the same or equivalent to those of the pipe holding connection structures 30a and 30b are denoted with the same reference numerals and differences therebetween will be mainly described in the following description.

FIG. 7 illustrates an embodiment of a high frequency antenna device according to the present invention. In the high frequency antenna device 90a, the first pipe 50 provided inside the vacuum container 4 is made of a conductor and portions near both end portions thereof pass through two openings 6 provided in wall surfaces in the vacuum container 4. To be more specific, in this embodiment, the pipe 50 has a straight line shape and the portions near both end portions thereof pass through two openings 6 provided in facing wall surfaces of the vacuum container 4.

In this case, examples of a material of the first pipe 50 include the above-described materials, but a material with high conductivity such as copper, aluminum, an alloy thereof, and the like is desirable among these.

Portions in which the portions near the end portions of the first pipe 50 pass through the openings 6 have the pipe holding connection structure 30a described with reference to FIG. 2 and the like, which is a structure in which the housing 32 is made of an insulating material.

Therefore, movement of the first pipe 50 in its axial both directions is stopped using the two locking parts 52 (refer to FIG. 2 and the like) provided near both end portions thereof.

Examples of a material of the housing 32 may include ceramics such as alumina, quartz, engineering plastics and the like such as polyphenylene sulfide (PPS) and polyether ether ketone (PEEK), and the like, but the present invention is not limited thereto.

Insulating members 92 configured to electrically insulate between the vacuum container 4 and the first pipe 50 are provided in the openings 6 in the vacuum container 4. Examples of a material of the insulating members 92 include the above-described materials exemplified as the materials of the housing 32, but the present invention is not limited thereto.

The first pipe 50 functions as a high frequency antenna when a high frequency current $I_R$ (a direction thereof is reversed in accordance with time) flows from a high frequency power supply (for example, refer to a high frequency power supply 130 in FIG. 11) thereto. An electrical connection through which the high frequency current $I_R$ flows to the pipe 50 may be the second pipe 60 connected to the pipe 50, for example, when the pipe 50 or the second pipe 60 in a portion protruding outward from the housing 32 is made of a conductor.

Since the pipe 50 has resistance, the pipe 50 generates heat when high frequency current $I_R$ flows therein (that is, Joule's heat is generated). The pipe 50 can be cooled using the fluid (for example, cooling water: the same as above) 2 flowing therein.

According to the high frequency antenna device 90a, a high frequency antenna device which accomplishes the same effects as those accomplished by the pipe holding connection structure 30a can be realized.

Like in this example, a portion of the first pipe 50 located inside the vacuum container 4 which functions as a high frequency antenna may be disposed inside an insulating pipe 94. Examples of a material of the insulating pipe 94 include quartz, alumina, a fluorocarbon resin, silicon nitride, silicon carbide, silicone, and the like, but the present invention is not limited thereto.

With such a configuration, the first pipe 50 can be protected using the insulating pipe 94. For example, even when the high frequency antenna device 90a is used for plasma generation (for example, refer to a plasma processing device shown in FIG. 11), charged particles in plasma can be prevented from being incident on the first pipe 50. Thus, a rise in plasma potential due to incidence of plasma on the first pipe 50 can be minimized and the first pipe 50 can be prevented from being sputtered due to charged particles in plasma. Therefore, for example, occurrence of metal contamination due to plasma can be minimized.

Like in this example, the first pipe 50 is preferably disposed inside the insulating pipe 94 with a space therebetween. Thus, even when a potential of the pipe 50 rises when a high frequency current $I_R$ flows through the pipe 50, an increase in potential in a surface of the insulating pipe 94 can be minimized. As a result, for example, an increase in potential in the plasma can be minimized. The same applies to a case of a high frequency antenna device 90b shown in FIG. 8.

Figure 10:
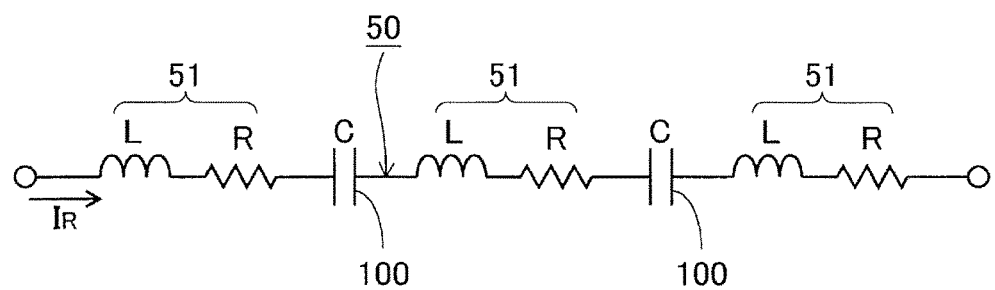
FIG. 10 is an electrical equivalent circuit diagram of the high frequency antenna device shown in FIG. 8.

Like the high frequency antenna device 90b shown in FIG. 8, a structure in which a portion of the first pipe 50 inside the vacuum container 4 which functions as a high frequency antenna is electrically divided into a plurality of compartments 51 using one or more hollow insulators 96 arranged in series, layered capacitors 100 are provided on outer circumferential portions of the hollow insulators 96, and the plurality of compartments 51 are electrically and directly connected with the capacitors 100 may be adopted. FIG. 10 illustrates an example of an electrical equivalent circuit in this case.

Examples of a material of the hollow insulators 96 may include ceramics such as alumina, a fluorocarbon resin, polyethylene (PE), engineering plastics such as polyphenylene sulfide (PPS) and polyether ether ketone (PEEK), and the like, but the present invention is not limited thereto.

The high frequency antenna device 90b includes two hollow insulators 96 and two capacitors 100 and the first pipe 50 is electrically divided into three compartments 51, but the number of divisions of the pipe 50 is not limited thereto.

The capacitors 100 can also mainly be cooled using the fluid 2 flowing through the pipe 50 (mainly through heat conduction between the hollow insulators 96).

Figure 9:
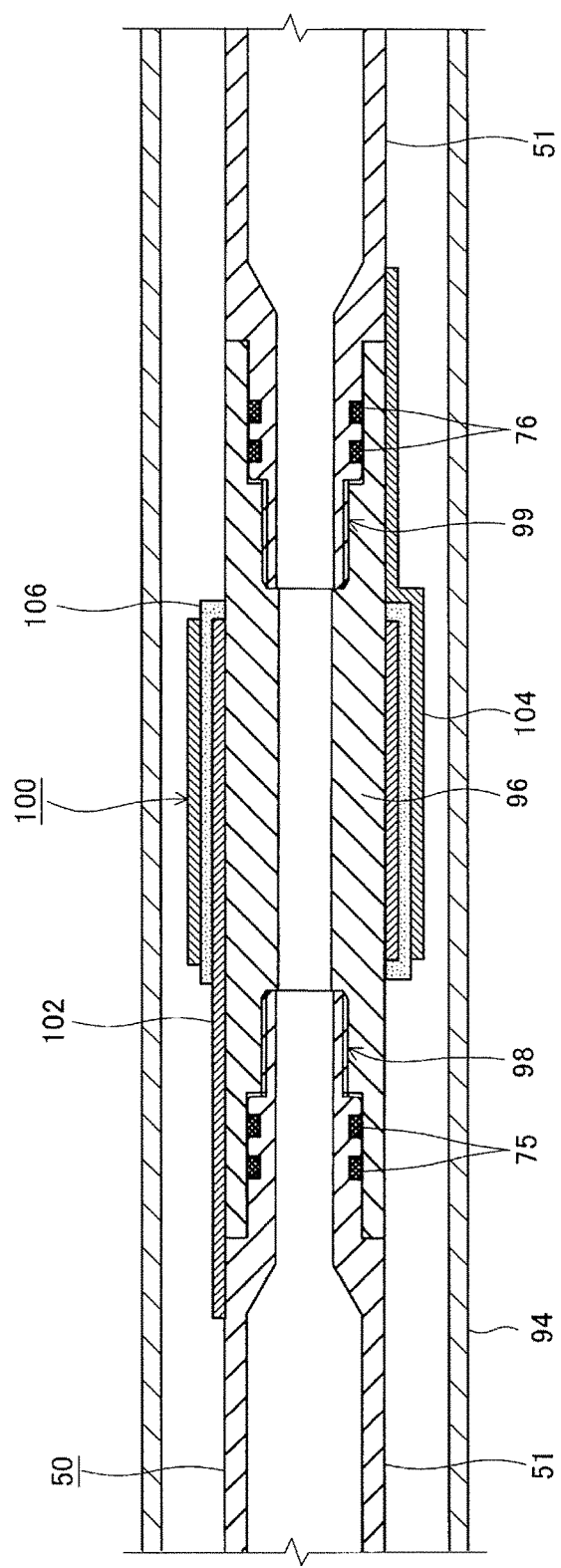
FIG. 9 is an enlarged cross-sectional view illustrating an example in the vicinity of one hollow insulator and one capacitor in FIG. 8.

FIG. 9 is an enlarged diagram of an example of a portion in the vicinity of one of the hollow insulators 96 and one of the capacitors 100 in FIG. 8. The capacitor 100 has a larger thickness than those of other constituent elements for the purpose of allowing easy understanding of the structure.

Connecting thread parts 98 and 99 and packings 75 and 76 used for sealing the fluid 2 are provided between the hollow insulator 96 and left and right compartments 51.

The capacitor 100 includes (a) a first electrode 102 which is an electrode disposed on an outer circumferential portion of the hollow insulator 96 and is electrically connected to one side of the compartment 51 connected to one side of hollow insulator 96, (b) a second electrode 104 which is an electrode disposed to overlap the first electrode 102 on the outer circumferential portion of the hollow insulator 96 and is electrically connected to the compartment 51 connected to the other side of the hollow insulator 96, and (c) a dielectric 106 disposed between the first electrode 102 and the second electrode 104.

The capacitor 100 may include one first electrode 102, one second electrode 104, and one dielectric 106 (FIG. 9 illustrates an example in this case) and may include a plurality of first electrodes 102, a plurality of second electrodes 104, and a plurality of dielectrics 106.

The high frequency antenna device 90b has a structure in which a first pipe 50 functioning as a high frequency antenna is divided into a plurality of compartments 51 using a hollow insulator 96, and the plurality of compartments 51 are electrically connected to each other in series using capacitors 100 provided on outer circumferential portions of the plurality of hollow insulators 96. In addition, since a combined reactance in the first pipe 50 is obtained simply by subtracting a capacitive reactance from an inductive reactance, impedance of the first pipe 50 can be reduced.

With regard to this, a case of a circuit equivalent to that shown in FIG. 10 will be described using an example. Here, an inductance and a resistance of compartments 51 and a capacitance of capacitors 100 are set to L, R, and C, respectively. An inductance L and a resistance R of the compartments 51 can be set to be substantially the same when the compartments 51 are set to have substantially the same length. An impedance Z of a first pipe 50 can be represented by the following equation. ω is an angular frequency of a high frequency current $I_R$ and j is an imaginary unit.

$$Z=3R+j(3\omega L-2/\omega C)$$

Since an imaginary part in the foregoing equation is a combined reactance of the first pipe 50 obtained by subtracting a capacitive reactance $2/\omega C$ from an inductive reactance $3\omega L$, an impedance Z of the first pipe 50 can be reduced by connecting the capacitors 100 in series. In other words, since the numbers of the compartments 51 and the capacitors 100 or the like can be appropriately selected, the impedance Z of the first pipe 50 can be accordingly designed to have an appropriate value regardless of a length of the first pipe 50.

As a result, even when the first pipe 50 is long, an increase of the impedance Z can be minimized. Therefore, generation of a significant potential difference between both end portions of the first pipe 50 can be suppressed. Furthermore, since an increase of the impedance Z can be minimized even when the first pipe 50 is long, a high frequency current $I_R$ easily flows to the first pipe 50.

Figure 11:
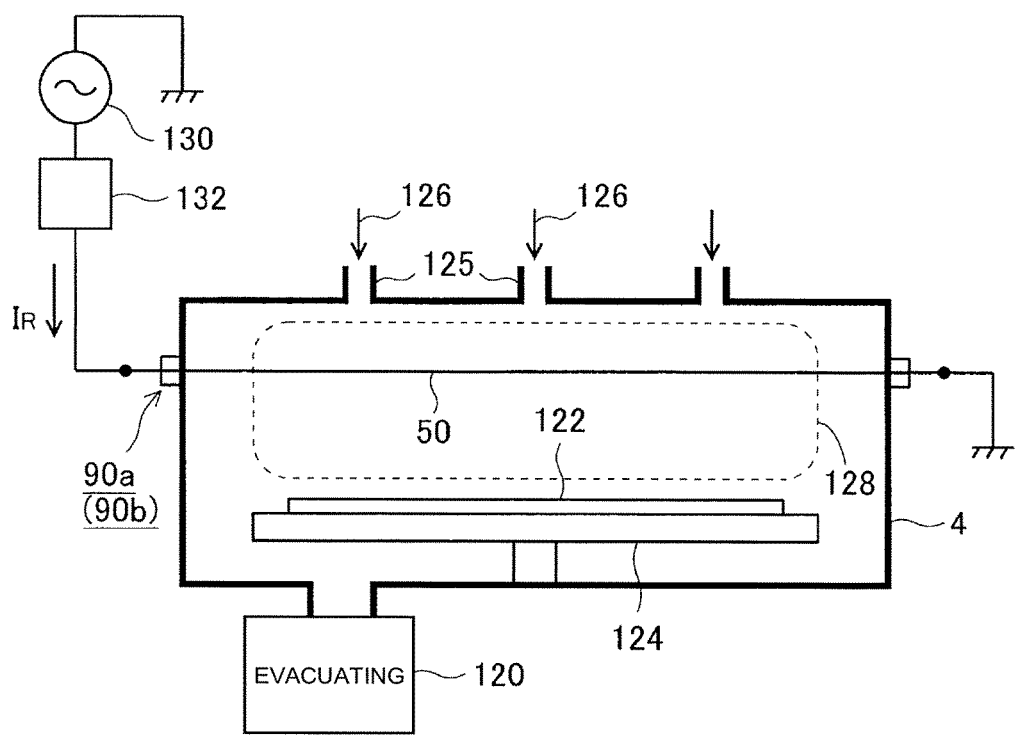
FIG. 11 is a schematic cross-sectional view illustrating an example of an inductive coupling type plasma processing device including a high frequency antenna device according to the present invention.

The above-described high frequency antenna device 90a or 90b generates an inductively coupled type plasma (which is abbreviated to ICP) using an induced electric field generated, for example, when a high frequency current $I_R$ flows to a high frequency antenna and thus can be used for an inductively coupled type plasma processing device configured to perform a process on a substrate using such a plasma. A schematic example of such a plasma processing device is illustrated in FIG. 11.

A substrate holder 124 configured to hold a substrate 122 to be processed is provided inside a vacuum container 4 which is evacuated to a vacuum using a vacuum evacuating device 120 and into which a required gas 126 is introduced through a gas introduction port 125. Moreover, the high frequency antenna device 90a or 90b is provided such that the straight-line-shaped first pipe 50 crosses an inside of the vacuum container 4 above the substrate 122. The high frequency antenna devices 90a and 90b are illustrated in a simplified form in the drawing.

A high frequency current $I_R$ flows from a high frequency power supply 130 to the first pipe 50 constituting the high frequency antenna device 90a or 90b via a matching circuit 132. A frequency of the high frequency current $I_R$ is generally, for example, 13.56 MHz, but the present invention is not limited thereto.

A high frequency current $I_R$ flows through the first pipe 50 so that a high frequency magnetic field is generated in the vicinity of the first pipe 50 and thus an induced electric field is generated in a direction opposite to that of the high frequency current $I_R$. Plasma (that is, inductively coupled type plasma) 128 is generated near the first pipe 50 by accelerating electrons inside the vacuum container 4 using the induced electric field and ionizing a gas 126 near the first pipe 50. The plasma 128 spreads to the vicinity of the substrate 122 and for example, a process such as film forming using a chemical vapor deposition (CVD) method or the like, etching, ashing, sputtering, and the like can be performed on the substrate 122 using the plasma 128.

Two pipe holding connection structures 30b shown in FIG. 5 may be provided instead of the two pipe holding connection structures 30a constituting the high frequency antenna device 90a or 90b.

Figure 6:
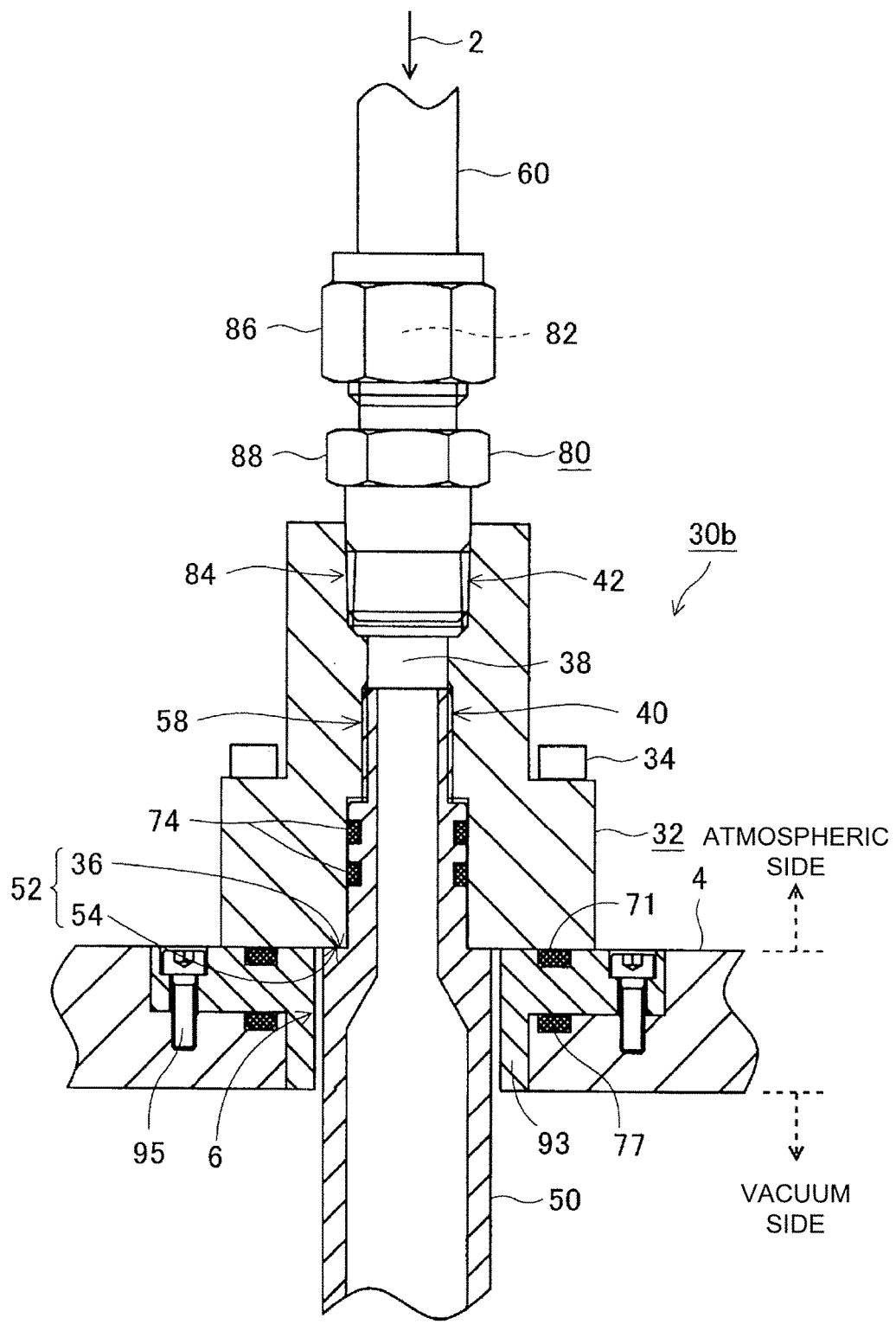
FIG. 6 is a cross-sectional view illustrating an example of a case in which the pipe holding connection structure shown in FIG. 5 is used for a high frequency antenna device.

FIG. 6 illustrates an example of a case in which the pipe holding connection structure 30b is used for a high frequency antenna device. Differences between such a case and a case in which the pipe holding connection structure 30a is used will be mainly described in the following description.

In this case, a housing 32 is made of a metal and an insulating member 93 configured to electrically insulate between the vacuum container 4 and the first pipe 50 and between the vacuum container and the housing 32 and is provided at an opening 6 in the vacuum container 4 and the vicinity thereof. The insulating member 93 is fixed to the vacuum container 4 using bolts 95 and a packing 77 vacuum-seals between the insulating member 93 and the vacuum container 4. An insulating member 93 for the purpose of insulating between the vacuum container 4 and the first pipe 50 and an insulating member 93 for the purpose of insulating between the vacuum container 4 and the housing 32 may be provided. Examples of a material of the insulating member 93 include the same materials as a material of the insulating members 92, but the present invention is not limited thereto. An electrical connection for the purpose of flowing a high frequency current $I_R$ to the pipe 50 may be performed, for example, in a portion of the housing 32 made of a metal.

When a high frequency antenna device includes the two pipe holding connection structures 30b, the high frequency antenna device in which the same effects as the effects accomplished by the two pipe holding connection structures 30b can be realized.

Also, one of the two pipe holding connection structures constituting the high frequency antenna device 90a or 90b may be set to the pipe holding connection structure 30a and the other thereof may be set to the pipe holding connection structure 30b. Thus, an antenna device in which a portion including the pipe holding connection structure 30a accomplishes the same effects as the effects accomplished by the pipe holding connection structure 30a and a portion including the pipe holding connection structure 30b accomplishes the same effects as the effects accomplished by the pipe holding connection structure 30b can be realized.

The invention claimed is:

1. A pipe holding connection structure which is a portion of a pipe passing through an opening in a vacuum container, through the pipe a fluid flows, the pipe holding connection structure comprising:
    a housing fixed to an outer wall of the vacuum container to air-tightly close the opening;
    a first pipe provided inside the vacuum container, wherein through the first pipe the fluid flows, a portion near an end portion of the first pipe passes through the opening in the vacuum container and the housing, the first pipe has a locking part near the end portion, the locking part is engaged with an end portion of the housing on the vacuum container side so as to stop outward movement of the first pipe from the vacuum container, and the first pipe has a male thread part on the end portion thereof;
    a first packing configured to vacuum-seal between the housing and the first pipe;
    a second pipe provided outside the vacuum container, wherein through the second pipe the fluid flows, the second pipe has a female thread part on the end portion thereof, and the female thread part is screwed to the male thread part of the first pipe to connect two pipes; and
    a second packing configured to seal between the end portion of the first pipe and the end portion of the second pipe.

2. A high frequency antenna device, comprising:
the pipe holding connection structure according to claim 1, the housing thereof is made of an insulating material,
wherein the first pipe is made of a conductor and portions near both end portions thereof pass through two openings provided in a wall surface in the vacuum container,
the pipe holding connection structure is provided in a portion in which a portion near each of the end portions of the first pipe passes through the opening,
an insulating member configured to electrically insulate between the vacuum container and the first pipe is provided in the opening in the vacuum container, and
the first pipe functions as a high frequency antenna when a high frequency current flows to the first pipe.

3. The high frequency antenna device according to claim 2, wherein a portion of the first pipe located inside the vacuum container is electrically divided into a plurality of compartments using one or more hollow insulators arranged in series, and
layered capacitors are provided on an outer circumferential portion of the hollow insulator, and the plurality of compartments are electrically and serially connected with the capacitors.

4. The high frequency antenna device according to claim 2, wherein the portion of the first pipe located inside the vacuum container is disposed inside an insulating pipe.

5. A pipe holding connection structure which is a portion of a pipe passing through an opening in a vacuum container, through the pipe a fluid flows, the pipe holding connection structure comprising:
a housing fixed to an outer wall of the vacuum container to air-tightly close the opening and having a through hole and a first female thread part and a second female thread part joined to the through hole therein;
a first pipe provided inside the vacuum container, wherein through the first pipe the fluid flows, a portion near an end portion of the first pipe passes through the opening in the vacuum container, the first pipe has a locking part near the end portion, the locking part is engaged with an end portion of the housing on the vacuum container side so as to stop outward movement of the first pipe from the vacuum container, the first pipe has a first male thread part on the end portion thereof, and the first male thread part is screwed to the first female thread part of the housing to connect the first pipe and the housing;
a packing configured to vacuum-seal between the housing and the first pipe;
a second pipe provided outside the vacuum container, wherein through the second pipe the fluid flows; and
a joint which has a portion connected to an end portion of the second pipe and a second male thread part screwed to the second female thread part in the housing and connects the second pipe to the housing when the fluid has been sealed.

6. A high frequency antenna device, comprising:
the pipe holding connection structure according to claim 5, the housing thereof is made of a metal,
wherein the first pipe is made of a conductor and portions near both end portions thereof pass through two openings provided in a wall surface in the vacuum container,
the pipe holding connection structure is provided in a portion in which a portion near each of the end portions of the first pipe passes through the opening,
insulating members configured to electrically insulate between the vacuum container and the first pipe and between the vacuum container and the housing are provided in each of the openings and the vicinity thereof in the vacuum container, and
the first pipe functions as a high frequency antenna when a high frequency current flows to the first pipe.

* * * * *